United States Patent
Lin

(10) Patent No.: US 8,138,047 B2
(45) Date of Patent: Mar. 20, 2012

(54) SUPER JUNCTION SEMICONDUCTOR DEVICE

(75) Inventor: Ming-Jang Lin, Hsinchu (TW)

(73) Assignee: inergy Technology Inc., Hsinchu County (TW)

( * ) Notice: Subject to any disclaimer, the term of this patent is extended or adjusted under 35 U.S.C. 154(b) by 381 days.

(21) Appl. No.: 12/419,308

(22) Filed: Apr. 7, 2009

(65) Prior Publication Data

US 2009/0250727 A1 Oct. 8, 2009

Related U.S. Application Data

(60) Provisional application No. 61/064,973, filed on Apr. 7, 2008.

(51) Int. Cl.
*H01L 21/336* (2006.01)
*H01L 29/78* (2006.01)

(52) U.S. Cl. ............... 438/268; 438/270; 257/E21.417; 257/E29.013

(58) Field of Classification Search .................. None
See application file for complete search history.

(56) References Cited

U.S. PATENT DOCUMENTS

| 6,586,201 | B1 * | 7/2003 | May et al. ............... 435/67 |
| 7,230,310 | B2 * | 6/2007 | Chen ..................... 257/487 |
| 7,601,597 | B2 * | 10/2009 | Takei .................... 438/270 |
| 2005/0250257 | A1 * | 11/2005 | Hossain et al. ............ 438/135 |

FOREIGN PATENT DOCUMENTS

JP 2002-026320 * 1/2002

* cited by examiner

*Primary Examiner* — Zandra Smith
*Assistant Examiner* — Pamela E Perkins
(74) *Attorney, Agent, or Firm* — CKC & Partners Co., Ltd.

(57) ABSTRACT

In the specification and drawing a super junction semiconductor device is disclosed. The super junction semiconductor device comprises a P-type layer, a $N^+$ substrate, a N-type layer, a silicon dioxide layer and a $P^+$ layer. The $N^+$ substrate is disposed under the P-type layer. The N-type layer is disposed on the N+ substrate. The silicon dioxide layer is disposed between the N-type layer and the P-type layer. The $P^+$ layer is disposed on the P-type layer and the N-type layer.

5 Claims, 6 Drawing Sheets

SUPER JUNCTION SEMICONDUCTOR DEVICE

RELATED APPLICATIONS

This application claims priority to American Provisional Application Ser. No. 61/064,973, filed Apr. 7, 2008, which is herein incorporated by reference.

BACKGROUND

1. Field of Invention

The present invention is related to a semiconductor device. More particularly, the present invention relates to a super junction semiconductor device.

2. Description of Related Art

Power semiconductor devices are used in many fields such as home electric appliance, automobile, electric train and electric transmission. Power semiconductor devices are applied to inverter systems and power supply circuits as switching mode devices. In these applications, under specific reverse blocking capability, lowering the specific on-resistance of power semiconductor device is necessary for reducing power losses in the systems. There had several versions of power semiconductor devices been published, such as planar gate MOSFET, trench gate MOSFET, lateral MOSFET and Vertical MOSFET, in order to improve the trade-off relationship of reverse blocking voltage and the specific on-resistance. More precisely, the definition of the trade-off relationship is that when increasing the reverse blocking voltage, the specific on-resistance will increase dramatically.

In view of solving the above sensitive relationship, super junction structure is used for designing the drift region of a power MOSFET. Due to its uniform lateral depletion of highly doped alternating P-type and N-type layer region, having outstanding reverse voltage sustainability and low specific on-resistance is no longer a problem. So far, super junction has been the most creative and important concept in power semiconductor device field. However, there are still several drawbacks of conventional super junction devices.

The major drawback is that while the development of conventional super junction devices to obtain the best trade-off between the reverse blocking voltage and specific on-resistance is hard to achieve, besides that shrinking the feature size without affecting the device characteristics is also difficult. Because conventional super junction devices suffer sever auto-doping effect after thermal process, which leads to degradation in the most important device parameters, such as reverse blocking voltage and the specific on-resistance. Especially when the P-type and N-type layer concentration is highly doped for a lower specific on-resistance performance, the auto-doping phenomenon will be even more drastic.

The deviation of the concentration will cause charge-imbalance to occur within the super junction P-type and N-type layers, at the same time the layer width might vary from the beginning design. The more impurity concentration deviation that a super junction has, the more device characteristics degradation it will obtain. Although much effort has been put into the feature size reduction while maintaining the desired breakdown voltage, it has been understood that there is a limit. For the foregoing reasons, the inventor realizes that there is a certain need for a new super junction device that may improve the above-mentioned problems.

SUMMARY

The following presents a simplified summary of the invention in order to provide a basic understanding to the reader. This summary is not an extensive overview of the invention and it does not identify key/critical elements of the present invention or delineate the scope of the present invention. Its sole purpose is to present some concepts disclosed herein in a simplified form as a prelude to the more detailed description that is presented later.

In one or more aspects, the present invention is directed to a super junction semiconductor device.

In accordance with an embodiment of the present invention, the super junction semiconductor device comprises a P-type layer, a $N^+$ substrate, a N-type layer, a silicon dioxide layer and a $P^+$ layer. The $N^+$ substrate is disposed under the P-type layer. The N-type layer is disposed on the N+ substrate. The silicon dioxide layer is disposed between the N-type layer and the P-type layer. The $P^+$ layer is disposed on the P-type layer and the N-type layer.

Accordingly, a silicon dioxide layer is inserted between the P-type and N-type layers of the super junction to reduce auto doping phenomenon, at the same time using the principle of charge compensation to reach fully depletion and break the silicon limit. The silicon dioxide layer can block the impurities diffusion, so that the design doping level and feature size can be well maintained after subsequent high temperature steps. This then allow manufacturers to increase the doping concentration and shrink the column width to achieve higher device reverse blocking voltage and lower specific on-state resistance trade-off.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein.

DESCRIPTION OF THE PREFERRED EMBODIMENTS

Figure 1:
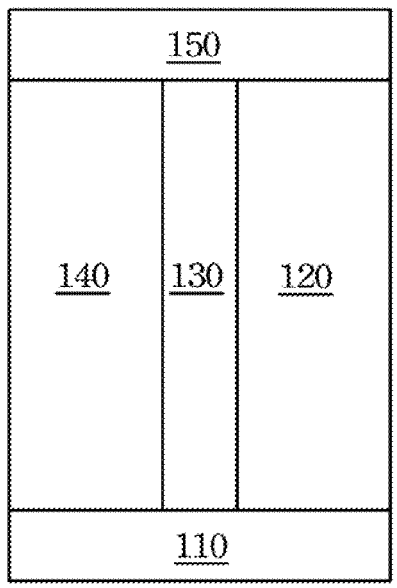
FIG. 1 is a cross-sectional view of a super junction semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Please refer to FIG. 1. FIG. 1 is a cross-sectional view of a super junction semiconductor device according to an embodiment of the present invention. In FIG. 1, the super junction semiconductor device 100 comprises a P-type layer 140, a N$^+$ substrate 110, a N-type layer 120 and a silicon dioxide layer 130. The N$^+$ substrate 110 is disposed under the P-type layer 140. The N-type layer 120 is disposed on the N+ substrate 110. The silicon dioxide layer 130 is disposed between the N-type layer 120 and the P-type layer 140.

The super junction semiconductor device 100 further comprises a P$^+$ layer 150. The P$^+$ layer 150 is disposed on the P-type layer 140, the silicon dioxide layer 130 and the N-type layer 120. The P-type layer 130 and the silicon dioxide layer 120 are disposed on the N$^+$ substrate 110. Moreover, silicon dioxide layer 130 may be extended underneath the P-type layer 140 to reduce auto doping phenomenon.

Figure 2:
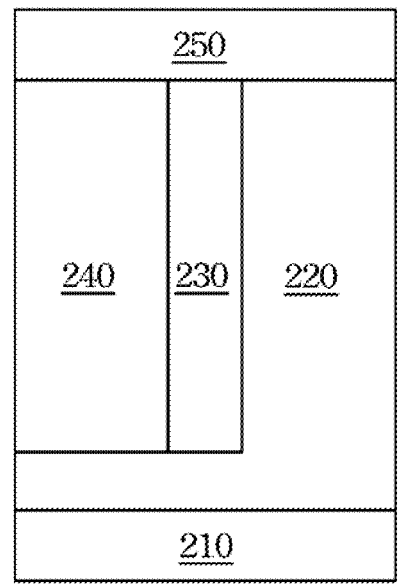
FIG. 2 is a cross-sectional view of a super junction semiconductor device according to another embodiment of the present invention.

Please refer to FIG. 2. FIG. 2 is a cross-sectional view of a super junction semiconductor 200 device according to another embodiment of the present invention. In FIG. 1, the super junction semiconductor device 200 comprises a P-type layer 240, a N$^+$ substrate 210, a N-type layer 220 and a silicon dioxide layer 230. The N$^+$ substrate 210 is disposed under the P-type layer 240. The N-type layer 220 is disposed on the N+ substrate 210. The silicon dioxide layer 230 is disposed between the N-type layer 220 and the P-type layer 240.

The super junction semiconductor device 200 further comprises a P$^+$ layer 250. The P$^+$ layer 250 is disposed on the P-type layer 240, the silicon dioxide layer 230 and the N-type layer 220. The P-type layer 240 and the silicon dioxide layer 230 are disposed on a portion of the N-type layer 220, where the portion of the N-type layer is a N$^-$ region disposed between the P-type layer 230 and the N$^+$ substrate 210 for adjusting electric field distribution. Moreover, silicon dioxide layer 230 may be extended underneath the P-type layer 240 to reduce auto doping phenomenon.

Figure 3:
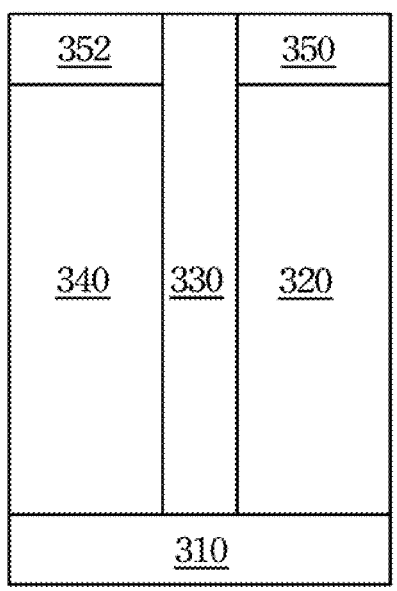
FIG. 3 is a cross-sectional view of a super junction semiconductor device according to another embodiment of the present invention.

Please refer to FIG. 3. FIG. 3 is a cross-sectional view of a super junction semiconductor 300 device according to another embodiment of the present invention. In FIG. 3, the super junction semiconductor device 300 comprises a P-type layer 340, a N$^+$ substrate 310, a N-type layer 320 and a silicon dioxide layer 330. The N$^+$ substrate 310 is disposed under the P-type layer 340. The N-type layer 320 is disposed on the N+ substrate 310. The silicon dioxide layer 330 is disposed between the N-type layer 320 and the P-type layer 340.

The super junction semiconductor device 300 further comprises a P$^+$ layer, wherein the P$^+$ layer is comprised of a P$^+$ region 352 and a P$^+$ region 350. The P$^+$ layer is disposed on the P-type layer 340 and the N-type layer 320. The P-type layer 340 and the silicon dioxide layer 320 are disposed on the N$^+$ substrate 310. The silicon dioxide layer 330 is disposed through the P$^+$ layer, so that the P$^+$ layer is divided into the P$^+$ region 352 and the P$^+$ region 350. Moreover, silicon dioxide layer 330 may be extended underneath the P-type layer 340 to reduce auto doping phenomenon.

Figure 4:
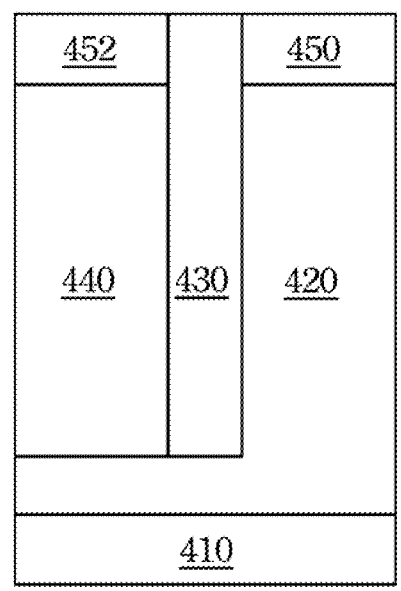
FIG. 4 is a cross-sectional view of a super junction semiconductor device according to another embodiment of the present invention.

Please refer to FIG. 4. FIG. 4 is a cross-sectional view of a super junction semiconductor 400 device according to another embodiment of the present invention. In FIG. 4, the super junction semiconductor device 400 comprises a P-type layer 440, a N$^+$ substrate 410, a N-type layer 420 and a silicon dioxide layer 430. The N$^+$ substrate 410 is disposed under the P-type layer 440. The N-type layer 420 is disposed on the N+ substrate 410. The silicon dioxide layer 430 is disposed between the N-type layer 420 and the P-type layer 440.

The super junction semiconductor device 400 further comprises a P$^+$ layer, wherein the P$^+$ layer is comprised of a P$^+$ region 452 and a P$^+$ region 450. The P$^+$ layer is disposed on the P-type layer 440 and the N-type layer 420. The P-type layer 440 and the silicon dioxide layer 430 are disposed on a portion of the N-type layer 420, where the portion of the N-type layer 420 is a N$^-$ region disposed between the P-type layer 440 and the N$^+$ substrate 410 for adjusting electric field distribution. The silicon dioxide layer 430 is disposed through the P$^+$ layer, so that the P$^+$ layer is divided into the P$^+$ region 452 and the P$^+$ region 450. Moreover, silicon dioxide layer 430 may be extended underneath the P-type layer 440 to reduce auto doping phenomenon.

Figure 5:
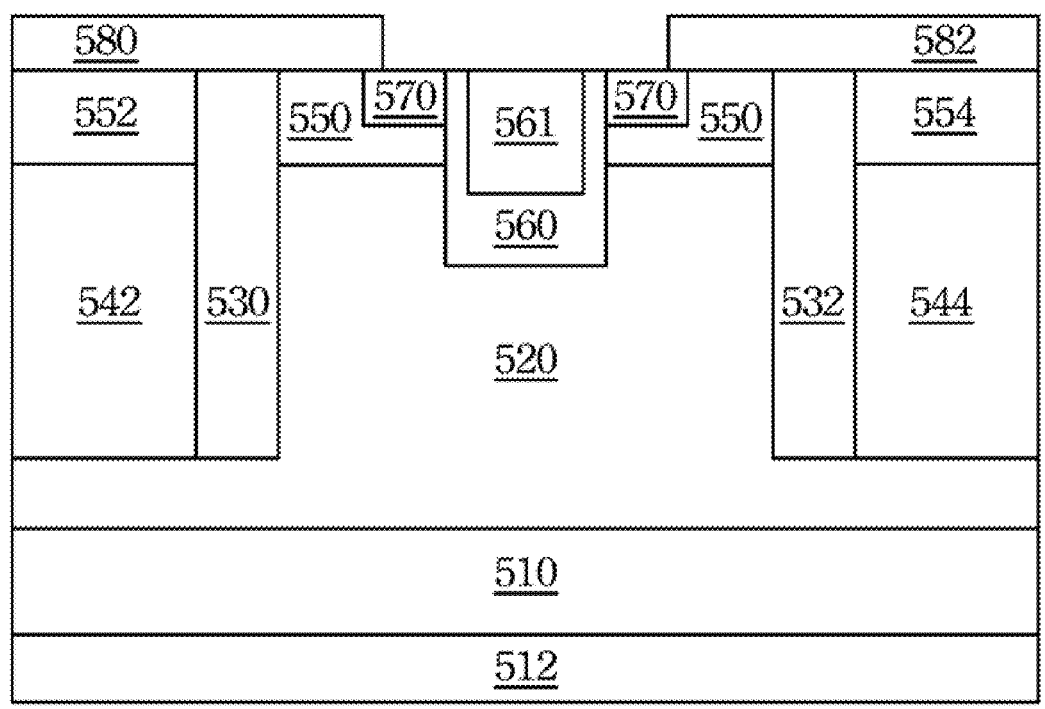
FIG. 5 is a cross-sectional view of a super junction semiconductor device according to another embodiment of the present invention.

Please refer to FIG. 5. FIG. 5 is a cross-sectional view of a super junction semiconductor 500 device according to another embodiment of the present invention In FIG. 5, the super junction semiconductor device 400 comprises a N$^+$ substrate 510, a P-type pillar 542, a P-type pillar 544, a N-type layer 520, a silicon dioxide layer 530, a silicon dioxide layer 532, a gate stack comprised of a gate dielectric 560 and a gate 561, a N$^+$ region 570 and a P-base layer, where the P-base layer is comprised of a P-base region 550, a P-base region 552 and a P-base region 554. The P-type pillars 542 and 544 are disposed above the N+ substrate 510. The N-type layer 520 has a N-region disposed on the N+ substrate 510 for adjusting electric field distribution and a N-type pillar formed on the N− region and disposed between the P-type pillars 542 and 544. The silicon dioxide layers 530 and 532 are disposed among the N-type pillar, P-type pillars 542 and 544, where the silicon dioxide layers 530 and 532 are disposed on the opposing sides of the N-type pillar. The gate stack comprised of a gate dielectric 560 and a gate 561 is disposed on the N-type pillar. The P-base layer surrounding the gate stack and disposed on the N-type pillar and the P-type pillars 542 and 544. The silicon dioxide layers 530 and 532 are disposed through the P-base layer. The first N+ region 570 surrounding the first gate stack is formed on the P-base layer and disposed between the silicon dioxide layers 530 and 532.

The super junction semiconductor device 500 further comprises a drain electrode 512. The drain electrode 512 is disposed under and electrically connected to the N+ substrate 510. Moreover, super junction semiconductor device 500 further comprises a source electrode 580 and a source electrode 582. The source electrode 580 is disposed on the P-base region 552 and contacts the N+ region 570. The source electrode 582 is disposed on the P-base region 554 and contacts the N+ region 570.

Figure 6:
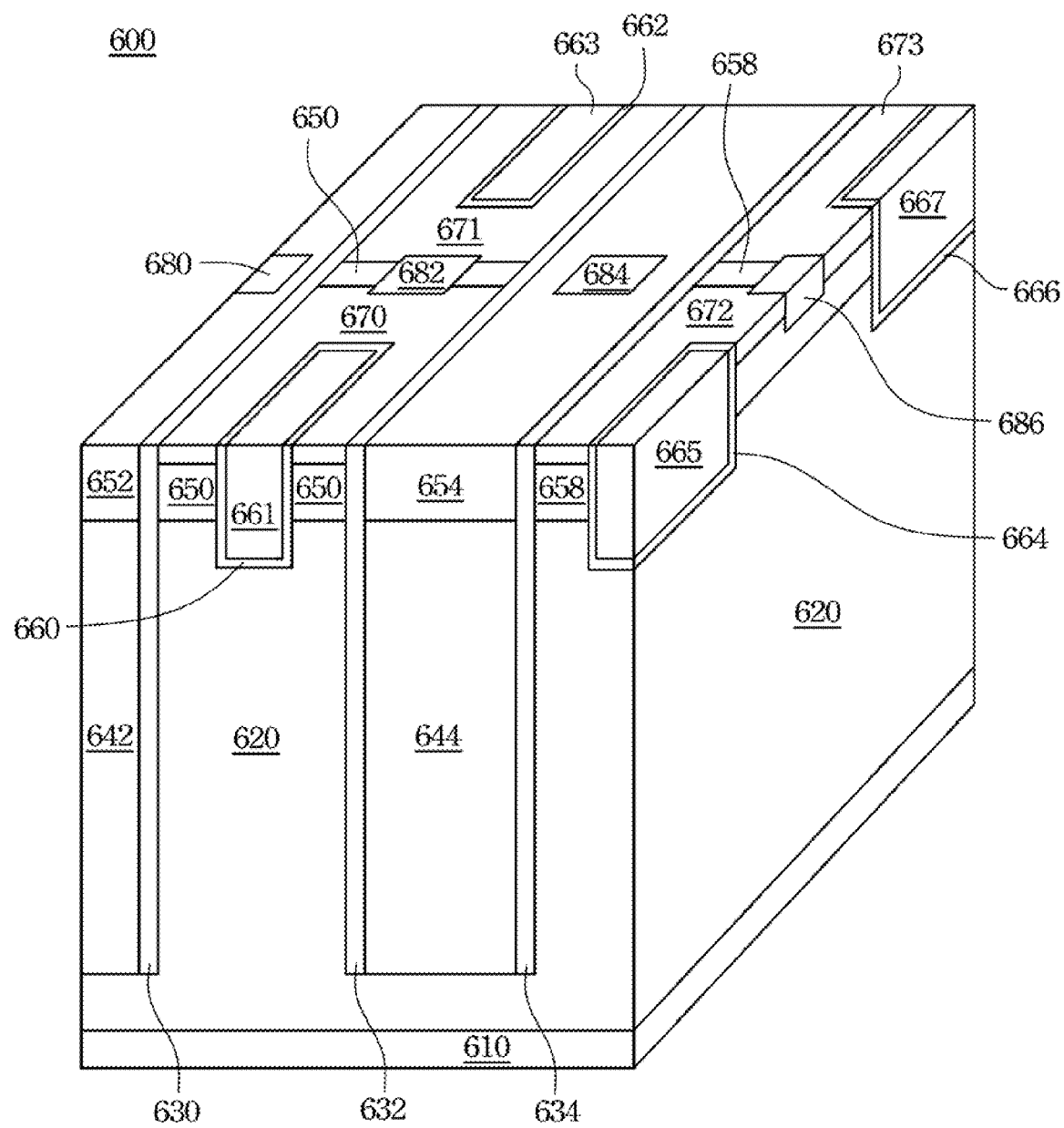
FIG. 6 is a three dimensional view of a super junction semiconductor device according to another embodiment of the present invention.

Please refer to FIG. 6. FIG. 6 is a three dimensional view of a super junction semiconductor device 600 according to another embodiment of the present invention. In FIG. 6, the super junction semiconductor device 600 comprises a N+ substrate 610, a P-type pillar 642, a P-type pillar 644, a N-type layer 620, a silicon dioxide layer 630, a silicon dioxide layer 632, a silicon dioxide layer 634, a first gate stack comprised of a gate dielectric 660 and a gate 661, another first gate stack comprised of a gate dielectric 664 and a gate 665, a N+ region 670, a N+ region 672 and a P-base layer, where the P-base layer is comprised of a P-base region 650, a P-base region 652, a P-base region 654 and a P-base region 658. The P-type pillars 642 and 644 are disposed above the N+ substrate 610. The N-type layer 620 has a N− region disposed on the N+ substrate 610 and two N-type pillars formed on the N− region, where one N-type pillar is disposed between the P-type pillars 642 and 644, where the P-type pillar 644 is disposed between these two N-type pillars. The silicon dioxide layers 630 and 632 are disposed among the P-type pillars 642 and 644 and N-type pillar. The silicon dioxide layers 630 and 632 are disposed on the opposing sides of one N-type pillar, and the silicon dioxide layers 630 is disposed on one side of another N-type pillar. The first gate stack comprised of a gate dielectric 660 and a gate 661 is disposed on one N-type pillar, and the first gate stack comprised of a gate dielectric 664 and a gate 665 is disposed on another N-type pillar. The P-base layer surrounding the first gate stacks and disposed on the N-type pillars and the P-type pillars 642 and 644. The silicon dioxide layers 630, 632 and 634 are disposed through the P-base layer. The first N+ region 670 surrounding one first gate stack is formed on the P-base layer and disposed between the silicon dioxide layers 530 and 532, and the first N+ region 672 surrounding another first gate stack is formed on the P-base layer.

The super junction semiconductor device 600 comprises a second gate stack and a second N+ region 671. The second gate stack comprised of comprised of a gate dielectric 662 and a gate 663 is disposed on one N-type pillar of the N-type layer 620. The P-base layer surrounds the second gate stack. The second N+ region 671 surrounding the second gate stack is formed on the P-base layer and is disposed between the silicon dioxide layers 630 and 632. The first N+ region 670 is disposed apart from the second N+ region 671. Similarly, The super junction semiconductor device 600 comprises another second gate stack and a second N+ region 673. The second gate stack comprised of comprised of a gate dielectric 666 and a gate 667 is disposed on another N-type pillar of the N-type layer 620. The second N+ region 673 surrounding the second gate stack is formed on the P-base layer. The first N+ region 672 is disposed apart from the second N+ region 673.

The super junction semiconductor device 600 comprises first source contacts 682 and 686. The first source contact 682 is disposed on the first N+ region 670 and the second N+ region 671. The first source contact 686 is disposed on the first N+ region 672 and the second N+ region 673. Moreover, the super junction semiconductor device 600 comprises second source contacts 680 and 684. The second source contact 680 is disposed on the P-base layer and directly above the P-type pillar 642. The second source contact 684 is disposed on the P-base layer and directly above the P-type pillar 644.

Figure 7:
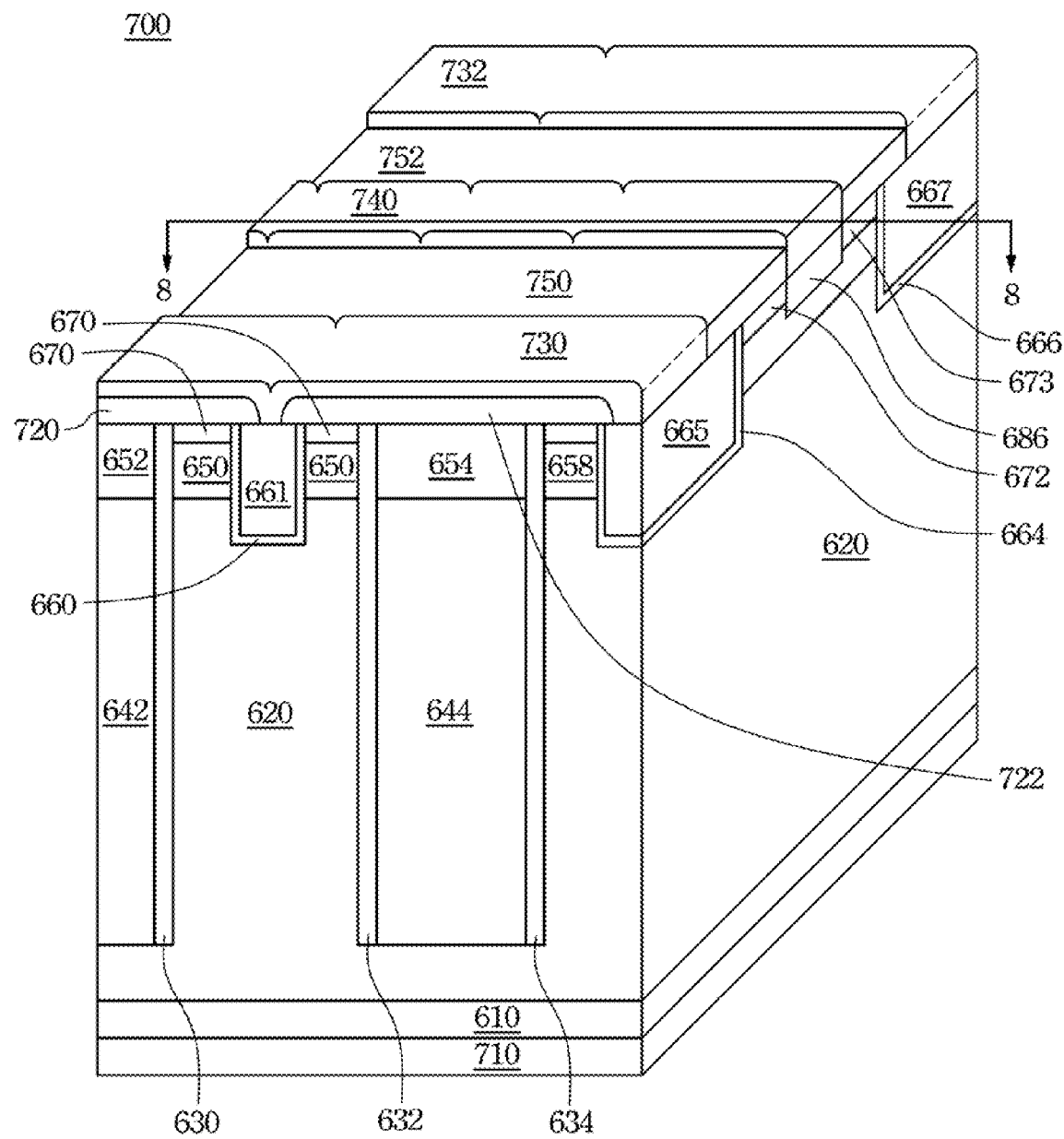
FIG. 7 is a three dimensional view of a super junction semiconductor device according to another embodiment of the present invention.

Please refer to FIG. 7. FIG. 7 is a three dimensional view of a super junction semiconductor device 700 according to another embodiment of the present invention. The super junction semiconductor device 700 is essentially the same as the super junction semiconductor device 600, except that electrodes and oxide are added.

In the super junction semiconductor device 700, the first gate electrode 730 is stretched over the P-type pillars 642 and 644 and the N-type pillars and is electrically connected to the first gate stacks. Similarly, the second gate electrode 732 is stretched over the P-type pillars 642 and 644 and the N-type pillar and is electrically connected to the second gate stack. The first gate electrode 730 substantially parallels the second electrode 732. The oxide layer may be comprised of oxides 720, 722, 750 and 752. The source electrode 740 is disposed between the first gate electrode 730 and the second gate electrode 732. The drain electrode 710 is disposed under and is electrically connected to the N+ substrate 610.

Figure 8:
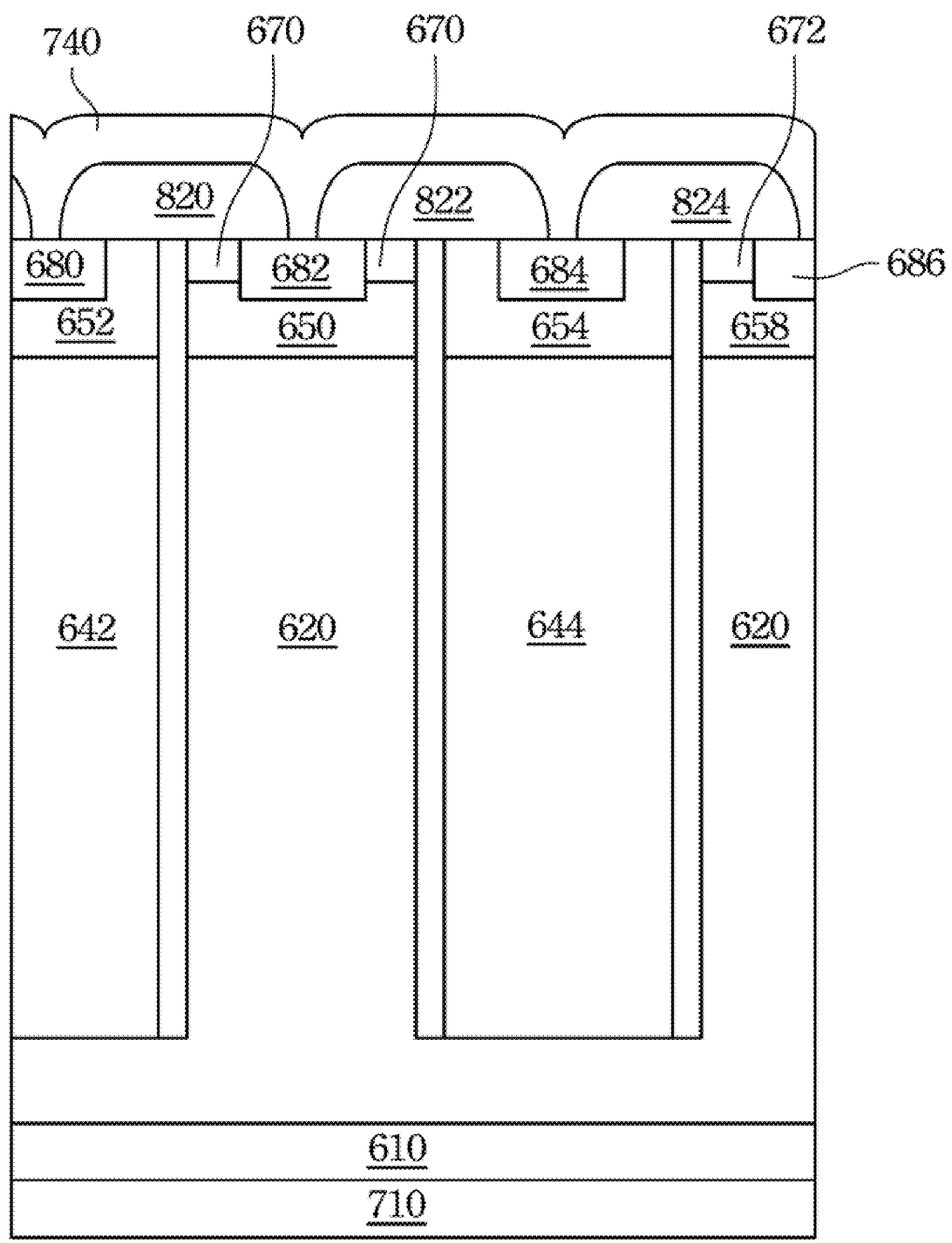
FIG. 8 is a cross-sectional view of the super junction semiconductor device, taken substantially along with the line 8-8 shown in FIG. 7.
Figure 9:
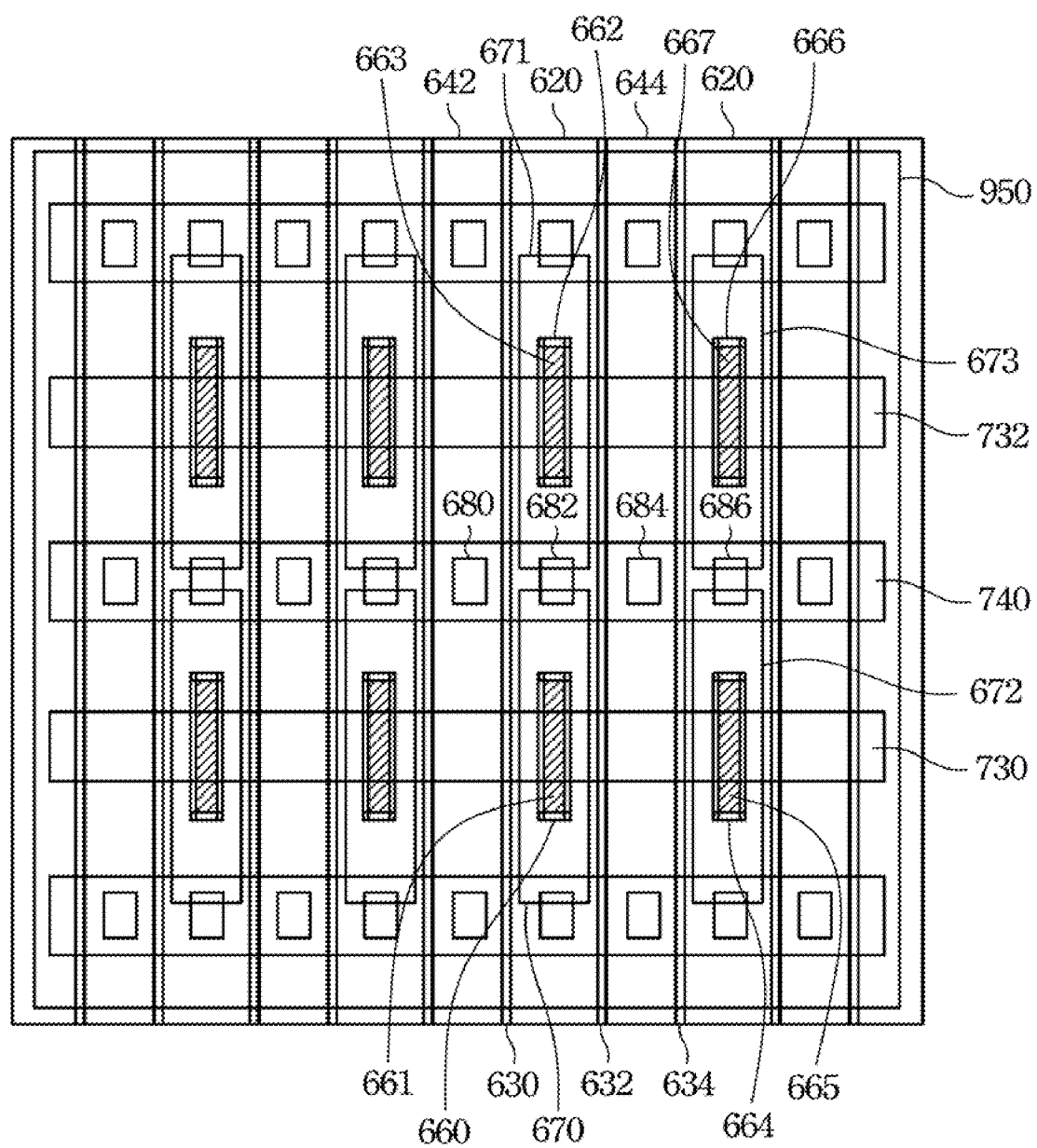
FIG. 9 is a top layout view of a super junction semiconductor device according to another embodiment of the present invention.

Please refer to FIG. 8. FIG. 8 is a cross-sectional view of the super junction semiconductor device 700, taken substantially along with the line 8-8 shown in FIG. 7. The source electrode 740 is stretched over the P-type pillars 642 and 644 and N-type pillar of the N-type layer 620 and is electrically connected to the source contacts 680,682,684 and 686. The oxide layer may be comprised of oxides 820, 822 and 824. Please refer to FIG. 9. FIG. 9 is a top layout view of a super junction semiconductor device according to another embodiment of the present invention. In FIG. 9, the disclosed super junction semiconductor device may be expanded into multiple constructions using the same structural geometry. The P-base layer 950 is essentially the same as the above P-base layer.

The foregoing outlines features of several embodiments so that those skilled in the art may better understand the aspects of the present invention. Those skilled in the art should appreciate that they may readily use the present invention as a basis for designing or modifying other processes and structures for carrying out the same purposes and/or achieving the same advantages of the embodiments introduced herein. Those skilled in the art should also realize that such equivalent constructions do not depart from the spirit and scope of the present invention, and that they may make various changes, substitutions and alterations herein without departing from the spirit and scope of the present invention.

What is claimed is:
1. A super junction semiconductor device, comprising:
    a P-type layer;
    a N+ substrate disposed under the P-type layer;
    a N-type layer disposed on the N+ substrate; and a silicon dioxide layer disposed laterally between the N-type layer and the P-type layer; and a P$^+$ layer disposed on the P-type layer and the N-type layer;

wherein the P-type layer and the silicon dioxide layer are disposed on the N$^+$ substrate, and the silicon dioxide layer is disposed through the P$^+$ layer.

2. The super junction semiconductor device as claimed in claim 1, wherein the P$^+$ layer is disposed on the silicon dioxide layer, wherein the P-type layer and the silicon dioxide layer are disposed on the N$^+$ substrate.

3. The super junction semiconductor device as claimed in claim 1, wherein the P$^+$ layer is disposed on the silicon dioxide layer, wherein the P-type layer and the silicon dioxide layer are disposed on a portion of the N-type layer, wherein the portion of the N-type layer is a N$^-$ region disposed between the P-type layer and the N$^+$ substrate.

4. A super junction semiconductor device, comprising:
a P-type layer;
a N$^+$ substrate disposed under the P-type layer;
a N-type layer disposed on the N$^+$ substrate; and
a silicon dioxide layer disposed laterally between the N-type layer and the P-type layer; and
a P$^+$ layer disposed on the P-type layer and the N-type layer;
wherein the P-type layer and the silicon dioxide layer are disposed on a portion of the N-type layer, and the portion of the N-type layer is a N$^-$ region disposed between the P-type layer and the N$^+$ substrate, wherein the silicon dioxide layer is disposed through the P$^+$ layer.

5. The super junction semiconductor device as claimed in claim 4, wherein the P$^+$ layer is disposed on the silicon dioxide layer, and the P-type layer and the silicon dioxide layer are disposed on the N$^+$ substrate.

* * * * *